US012800644B2

(12) United States Patent
Kumar et al.

(10) Patent No.: US 12,800,644 B2
(45) Date of Patent: Nov. 17, 2026

(54) DYNAMIC ON-RESISTANCE AND THRESHOLD VOLTAGE INSTABILITY EVALUATION CIRCUIT FOR POWER DEVICES AND OPERATION METHOD THEREOF

(71) Applicant: National Yang Ming Chiao Tung University, Hsinchu City (TW)

(72) Inventors: Rustam Kumar, Patna (IN); Tian-Li Wu, Taoyuan City (TW)

(73) Assignee: NATIONAL YANG MING CHIAO TUNG UNIVERSITY, Hsinchu City (TW)

( * ) Notice: Subject to any disclaimer, the term of this patent is extended or adjusted under 35 U.S.C. 154(b) by 297 days.

(21) Appl. No.: 18/611,024

(22) Filed: Mar. 20, 2024

(65) Prior Publication Data

US 2025/0298068 A1 Sep. 25, 2025

(51) Int. Cl.

*G01R 31/26* (2020.01)
*G01R 19/28* (2006.01)
*G01R 27/04* (2006.01)

(52) U.S. Cl.

CPC ......... *G01R 31/2621* (2013.01); *G01R 19/28* (2013.01); *G01R 27/04* (2013.01)

(58) Field of Classification Search

None

See application file for complete search history.

(56) References Cited

U.S. PATENT DOCUMENTS 3,965,420 A * 6/1976 Bennett .............. G01R 31/2608 324/762.08
4,538,106 A * 8/1985 Anderson .......... G01R 31/2608 324/762.08
9,310,408 B2 4/2016 Mikata et al.
9,984,190 B1 * 5/2018 Aurich .................. G06F 30/367
10,094,863 B2 10/2018 Bahl et al.

(Continued)

OTHER PUBLICATIONS

"B1505A power device analyzer/curve tracer", Keysight Technology, May 2022, total 83 pages, https://www.keysight.com/in/en/assets/7018-02115/data-sheets/5990-3853.pdf.

(Continued)

*Primary Examiner* — Richard Isla

(74) *Attorney, Agent, or Firm* — Birch, Stewart, Kolasch & Birch, LLP

(57) ABSTRACT

A dynamic on-resistance and threshold voltage instability evaluation circuit for power devices and its operation method thereof are provided. The evaluation circuit includes a first switch element and a device under test which forms a half bridge circuit, an RL load, as well as a second switch element in parallel with a capacitor. The device under test is connected as a lower switch of the half bridge circuit. And the RL load enables repetitive hard switching operation of the device under test for dynamic on-resistance measurement. The second switch element in parallel with the capacitor enables threshold voltage measurement of the device under test. By adopting the circuit to characterize both instabilities of dynamic on-resistance and gate threshold voltage, the present invention is beneficial to achieving in shorter pulse width, faster measuring speed and inexpensive measuring equipment, and can thus be widely applied to group III-N based power devices.

21 Claims, 7 Drawing Sheets

(56) References Cited

U.S. PATENT DOCUMENTS

| | | | | |
|---|---|---|---|---|
| 11,575,377 | B2 | 2/2023 | Kim et al. | |
| 11,698,404 | B2 * | 7/2023 | Lin | H03K 17/6871 324/750.01 |
| 2005/0102128 | A1 | 5/2005 | Wilhelm | |
| 2011/0050270 | A1 * | 3/2011 | Miyazaki | G01R 31/2621 324/762.01 |
| 2016/0079401 | A1 | 3/2016 | Zhang | |
| 2024/0385235 | A1 * | 11/2024 | Ishii | G01R 31/2608 |

OTHER PUBLICATIONS

Kumar et al., "Dynamic On-Resistance and Threshold Voltage Instability Evaluation Circuit for Power GaN HEMTs Devices", IEEE Transactions On Industrial Electronics, Nov. 28, 2023, pp. 1-4, total 7 pages.

Kumar, English Abstract for "Reliability Evaluation Circuits for GaN HEMTs Devices in Power Electronics Applications", in the doctoral dissertation at National Yang Ming Chiao Tung University, the whole contexts will be publicly available on Jul. 27, 2026, total 8 pages.

Li et al., "Accurate Measurement of Dynamic on-State Resistances of GaN Devices Under Reverse and Forward Conduction in High Frequency Power Converter", IEEE Transactions on Power Electronics, Sep. 2020, vol. 35, No. 9, pp. 9650-9660.

Yang et al., "Characterization of threshold voltage instability under off-state drain stress and its impact on p-GaN HEMT performance", IEEE Journal of Emerging and Selected Topics in Power Electronics, Aug. 2021, vol. 9, No. 4, pp. 4026-4035.

* cited by examiner

DYNAMIC ON-RESISTANCE AND THRESHOLD VOLTAGE INSTABILITY EVALUATION CIRCUIT FOR POWER DEVICES AND OPERATION METHOD THEREOF

BACKGROUND OF THE INVENTION

Field of the Invention

The present disclosure is related to a scheme diagram of both gate threshold voltage ($V_{th}$) and on-resistance ($R_{ds,on}$) instability measurement circuit. And more particularly, the present invention is related to a measurement and evaluation circuit and its operation method using the same to characterize both the gate threshold voltage and dynamic on-resistance instability for Group III-N based power devices, in which the objectives of a shorter pulse width, faster measurement time and less costly measuring equipment can be accomplished by employing the present invention.

Description of the Prior Art

As known, Gallium Nitride (GaN) based power devices have become key components of power electronics' circuits because of their low on-resistance ($R_{ds,\ on}$) and fast switching speed in recent years. These features are achieved due to Aluminum Gallium Nitirde/GaN heterojunction inside the device, which creates two-dimensional electron gas (2-DEG) layer, and this 2-DEG offers lower low on-resistance $R_{ds,\ on}$. In addition, it is also known that the GaN has a large bandgap compared with Silicon (Si). And due to such material property, it allows the GaN to sustain a high critical electrical field and causes the device to be able to shrink for the same breakdown voltage. It is believed that such shirk in device size is beneficial to offer low junction capacitance, which results in a much faster switching speed of the device.

These GaN-based power devices are normally-ON devices. However, for safety purposes, it is known that a power electronics circuit usually prefers a normally-OFF device. As a result, there have been several methodologies, so far, to be explored to achieve these normally OFF devices, such as producing recessed gate, implanted gate, cascade structure, and/or p-GaN gate. In general, among in these applications, normally off devices are preferred due to the simplified gate-driving circuitry. And different technologies are thus being investigated to achieve the normally off operation of these devices, such as cascade configuration, metal-insulator-semiconductor structure, and p-GaN gate structure. Currently, among these provided methods, the p-GaN gate structure has been widely used in commercial devices. And yet, it draws our attention that this type of device still suffers from certain drawbacks, such as the threshold voltage ($V_{th}$) and dynamic on-resistance ($R_{ds,on}$) instability. And such instability issues in GaN high-electron mobility transistors (HEMTs) are mainly caused by the possible mechanisms including defective state generation and electron trapping/hole deficiency inside the device. In order to measure these instabilities, several test circuits have been discussed in the prior arts. For instance, a capacitive voltage divider and a half-bridge (HB) circuit were discussed and parallel-connected. For measuring $R_{ds,on}$ in the repetitive hard-switching (HS) operation, a series combination of resistive and inductive load (RL) is inserted between the switching node and the high-side switch's drain terminal in the half-bridge circuit. In another prior art, a test circuit consists of two parallel-connected half-bridge circuits are also proposed. To measure the $R_{ds,on}$ in the repetitive hard-switching operation, an RL load is inserted between the switching nodes of the two half-bridge circuits. These test circuits are specially designed for measuring $R_{ds,on}$ instability in repetitive switching conditions. However, it is noticeable that the $V_{th}$ instability measurement is not discussed yet among these prior arts.

On the other hand, as known, a conventional typical curve tracer is used to measure the threshold voltage ($V_{th}$) instability. However, such curve tracer is only able to apply a minimum of hundreds of micro seconds (μs) pulse and the stress conditions are only applicable to the OFF-state. And this time duration is too large for the actual switching frequency of the device. In addition, the curve tracer with N1265A is able to reduce the minimum pulse width to 20 μs. And yet, the setup is still unable to measure the threshold voltage ($V_{th}$), if the device is switching lesser than 20 μs. Such pulse width limitation restricts measurements at high-frequency operations. Also, such setup requires an expensive interface for the connection and packaging measurement, and the overall setup will become relatively too high to afford. In order to overcome the limitations, a test circuit may be used, consisting of a series connection of a half-bridge circuit and a capacitor. The capacitor is connected to the low-side switch of the half-bridge circuit. Nevertheless, such test circuit is only able to measure the $V_{th}$ instability in a single switching cycle, and it does not discuss the $R_{ds,on}$ instability at the same time. In order to measure both instabilities of $R_{ds,on}$ as well as $V_{th}$, it is believed that separate test circuits must be required. And yet, using separate test circuits introduces variabilities in circuit parameters and different stress conditions during the measurement of both instabilities.

As a result, based on the foregoing drawbacks and necessary suppression and elimination of the conventional issues are thus to be expected, it, in view of all, should be apparent and obvious that there is indeed an urgent need for the professionals in the field for a novel and inventive test circuit structure diagram to be developed, so as to solve the above-mentioned issues occurring in the prior and related arts. By adopting the disclosed technical solution of the present invention, an evaluation circuit that is able to measure both the threshold voltage ($V_{th}$) and dynamic on-resistance ($R_{ds,on}$) instabilities is provided, and the aforementioned issues existing in the prior and related arts are to be addressed. In particular, please proceed to find a complete and full detailed specific description and several implementations, which are now to be provided by the Applicants of the present invention in the following paragraphs in the below for your references.

SUMMARY OF THE INVENTION

In order to overcome the above-mentioned disadvantages, one major objective in accordance with the present invention is provided for a novel and creative circuit scheme so as to achieve both dynamic on-resistance instability and threshold voltage instability measurements.

Since a typical curve tracer was only able to be used to measure the gate threshold voltage, and the curve tracer was only able to apply a minimum of 500 micro seconds (μs) pulse during OFF state, it is known that such time duration is too large for the actual switching frequency of group III-N based devices (GaN, AlN, and AlGaN). Therefore, according to the present invention, the invention is able to provide lesser than 2 μs pulse during OFF state, which represents real operating switching frequency for group III-N based devices.

Moreover, in the prior arts, dynamic on-state resistance must be measured by using a certain measurement circuit in the repetitive switching application, however gate threshold voltage shift measurement is not possible by adopting the same measurement circuit. On the contrary, according to the present invention, it is verified that the invention is able to measure both the on-state resistance and threshold voltage shift in actual application for group III-N based devices.

In addition, the conventional prior arts are known as using a half-bridge circuit to achieve the minimum duration of the OFF state pulse and a current source for threshold voltage measurement. However, the threshold voltage measurement in repetitively switching operation is not applicable. Also, on-state resistance measurement is not achievable by using the conventional circuit, either. To address the deficiencies, the present invention is able to measure both threshold voltage shift and on-state measurement in repetitively switching operation for group III-N based devices.

And also, one another objective in accordance with the present invention is to provide a novel dynamic on-resistance and threshold voltage instability evaluation circuit for power devices, in which the power device is a device fabricated using Group III-N based semiconductor materials. The purposed measurement circuit is aimed to characterize both the dynamic on-resistance as well as the threshold voltage instability for Group III-N based devices, including for instance, GaN, AlN, AlGaN devices, and so on. As compared to the prior arts, the present invention ensures to offer a low-cost circuit diagram which is capable of measuring the $V_{th}$ shift due to not only OFF state stress but also switching transient current for group III-N based devices in high-frequency applications. In addition, a half-bridge circuit electrically connected with an RL assemble load enables repetitive switching operation to evaluate dynamic on-resistance ($R_{ds,on}$) of a device under test.

And yet, one more another objective in accordance with the present invention is to provide an inventive power device threshold voltage measurement circuit and its operation method thereof as well. By employing the disclosed technical contents, it is verified that a much shorter pulse width which is less than 2 micro seconds (μs) during OFF state can be achieved by employing the present invention. In such a way, it is believed that since the present invention is able to provide lesser than 2 μs pulse width during OFF state, which represents the real operating switching frequency for group III-N based devices, the present invention can thus be practically applied to the semiconductor power devices industries nowadays, especially for group III-N based devices. In addition, the disclosed power device dynamic on-resistance and threshold voltage instability evaluation circuit in the present invention is also advantageous of having less circuit complexity in circuit diagram since it can simply be implemented by using a series connection of a half-bridge (HB) circuit with an RL assemble load and a bypass switch with a capacitor connected in parallel. As a result, it is apparent that the relative cost of the disclosed dynamic on-resistance and threshold voltage instability evaluation circuit for the power device of the present invention can be significantly reduced, which accordingly will be able to accelerate the development of the group III-N based devices. By employing such circuit design figure, it is apparent that the circuit layout complexity of the present invention is able to be made lowered and easy to be in control.

Therefore, in the following descriptions, the Applicants of the present invention will proceed to provide a plurality of embodiments and variations that will be discussed later in the following paragraphs in order to verify that the proposed dynamic on-resistance and threshold voltage instability evaluation circuit for power devices and its operation method thereof, which are disclosed in the present invention are effective. And hence, thereby, it is worthy of full attentions that the present invention achieves to successfully solves the problems of prior arts and meanwhile maintain superior electrical properties. As a result, it is believed that the proposed technical contents of the present invention are extremely advantageous of as being highly competitive and able to be widely utilized in related IC and semiconductor industries.

Therefore, in order to achieve the above-mentioned plural objectives, the present invention is aimed to provide a modified dynamic on-resistance and threshold voltage instability evaluation circuit for power devices, which will now be introduced as follows.

According to the present invention, a dynamic on-resistance and threshold voltage instability evaluation circuit for power devices is firstly provided. The disclosed dynamic on-resistance and threshold voltage instability evaluation circuit includes a half-bridge circuit, which is electrically connected to and receiving an input voltage, wherein the half-bridge circuit comprises a first switch element and a device under test which are connected in series; an assemble load, which is electrically connected between the input voltage and a midpoint of the half-bridge circuit, wherein the assemble load enables repetitive hard-switching operation of the device under test for dynamic on-resistance measurement of the device under test; and a switch combining circuit, which is electrically connected between the half-bridge circuit and a ground terminal, and the switch combining circuit is adopted for enabling threshold voltage measurement of the device under test.

According to the embodiment of the present invention, the first switch element is a metal oxide semiconductor field effect transistor (MOSFET), and a drain terminal of the metal oxide semiconductor field effect transistor is electrically connected to the input voltage, a gate terminal of the metal oxide semiconductor field effect transistor is electrically connected with a first gate driver for receiving a first driving voltage such that the first driving voltage is a gate driving voltage of the first switch element, and a source terminal of the metal oxide semiconductor field effect transistor is electrically connected with the assemble load and the device under test.

In addition, the device under test is a Group III-N based MOSFET, and a drain terminal of the Group III-N based MOSFET is electrically connected to the source terminal of the first switch element and the assemble load, a gate terminal of the Group III-N based MOSFET is electrically connected with a second gate driver for receiving a second driving voltage such that the second driving voltage is a gate driving voltage of the device under test, and a source terminal of the Group III-N based MOSFET is electrically connected with the switch combining circuit.

According to the embodiment of the present invention, the device under test is preferably a power device, and the power device is fabricated in using Group III-N based semiconductor materials, for instance, as a GaN, AlN, or AlGaN power device.

In addition, the disclosed assemble load comprises a resistor and an inductor which are connected in series, one end of the resistor is electrically connected with the input voltage while another end of the resistor is electrically connected with the inductor, and the inductor is further electrically connected to a joint where the first switch element and the device under test are connected.

Moreover, the disclosed switch combining circuit comprises a second switch element and a capacitor which are connected in parallel. According to the embodiment of the present invention, the second switch element with the capacitor connected in parallel enables the measurement of $V_{th}$ instability. Specifically, the second switch element is a metal oxide semiconductor field effect transistor (MOSFET), and a drain terminal of the metal oxide semiconductor field effect transistor is electrically connected to the device under test of the half-bridge circuit, a gate terminal of the metal oxide semiconductor field effect transistor is electrically connected with a third gate driver for receiving a third driving voltage such that the third driving voltage is a gate driving voltage of the second switch element, and a source terminal of the metal oxide semiconductor field effect transistor is electrically connected with the ground terminal.

Regarding the measurement of dynamic on-resistance of the device under test, the second switch element is turned on first such that the first switch element and the device under test are operated complementarily at a certain duty cycle. And during an on state of the device under test, it induces an inductor current flowing through the assemble load to be increased, and then during an off state of the device under test, the inductor current will be decreased to reach a steady state where the dynamic on-resistance of the device under test can be measured.

According to the technical solution of the present invention, when the steady state is achieved, it is indicated by the inductor current "$I_L$" which is equal to "$d\times V_{in}/R_s$", where d is the certain duty cycle of the device under test, $V_{in}$ is a voltage value of the input voltage and $R_s$ is the resistance of the resistor, such that $I_L=d\times V_{in}/R_s$.

As a result, when the steady state is achieved as "$I_L=d\times V_{in}/R_s$", an on-state voltage across the device under test can be measured as "$V_{ds,on}$", and the dynamic on-resistance of the device under test can be accordingly obtained as "$V_{ds,on}/I_L$".

In another aspect, when regarding the measurement of threshold voltage instability of the device under test, it is, on the other hand, the second switch element to be turned off and the device under test is turned on such that the inductor current flows through the device under test and charges the capacitor, leading to an increase in a voltage at a source terminal of the device under test. Also, a decrease in a voltage drop across a gate terminal and the source terminal of the device under test is accordingly generated.

As a result, it is obtained that the inductor current flowing through the device under test will be accordingly decreased due to the decrease in the voltage drop across the gate terminal and the source terminal of the device under test, and when the inductor current flowing through the device under test reaches a threshold current ($I_{th}$), a voltage across the gate terminal and the source terminal of the device under test can be determined as a threshold voltage ($V_{th}$) of the device under test.

And subsequently, after the threshold voltage of the device under test is measured, the device under test can be turned off such that the inductor current freewheels through the first switch element.

And the second switch element can be successively turned on in order to discharge the capacitor and pull down the source terminal of the device under test to a ground voltage, which allows the device under test and the first switch element to continue operating in a steady-state condition.

According to the embodiment of the present invention, the first switch element and the device under test forms the half-bridge (HB) circuit and the device under test is connected as a lower switch of the half-bridge (HB) circuit. It is believed that the half-bridge (HB) circuit with the abovementioned assemble load (including the resistor R and the inductor L) are employed so as to enable repetitive switching operation to evaluate dynamic on-resistance ($R_{ds,\ on}$) of the device under test.

On the other hand, a bypass switch (which is the second switch element) with a capacitor connected in parallel, which form the disclosed switch combining circuit of the present invention, being electrically connected between the half-bridge circuit and a ground terminal is adopted so as to enable the measurement of threshold voltage ($V_{th}$) of the device under test.

By employing both technical contents as provided above, the present invention successfully achieves in measuring both instability on-state resistance and threshold voltage shift in the repetitive switching conditions.

In addition, regarding the operation method of such measurement circuit scheme, the present invention, in another aspect, also provides an operation method of the dynamic on-resistance and threshold voltage instability evaluation circuit for power devices. The disclosed operation method includes a plurality of following steps:

(A): providing a half-bridge circuit and electrically connecting the half-bridge circuit to an input voltage, wherein the half-bridge circuit comprises a first switch element and a device under test which are connected in series;

(B): electrically connecting an assemble load between the input voltage and a midpoint of the half-bridge circuit for enabling repetitive hard-switching operation of the device under test for dynamic on-resistance measurement of the device under test; and (C): electrically connecting a switch combining circuit between the half-bridge circuit and a ground terminal, such that the switch combining circuit enables threshold voltage measurement of the device under test.

In details, according to the embodiment of the present invention, the switch combining circuit comprises a second switch element and a capacitor which are connected in parallel, the second switch element is a metal oxide semiconductor field effect transistor (MOSFET), and a drain terminal of the metal oxide semiconductor field effect transistor is electrically connected to the device under test of the half-bridge circuit, a gate terminal of the metal oxide semiconductor field effect transistor is electrically connected with a gate driver for receiving a gate driving voltage, and a source terminal of the metal oxide semiconductor field effect transistor is electrically connected with the ground terminal.

The disclosed operation method is aimed to turn on the second switch element and control the first switch element and the device under test to operate complementarily at a certain duty cycle first. Then, the device under test is turned on, such that an inductor current flowing through the assemble load is increased, and then the disclosed operation method proceeds to turn off the device under test, such that the inductor current is decreased to reach a steady state where $I_L=d\times V_{in}/R_s$ and a dynamic on-resistance of the device under test can be measured as $V_{ds,on}/I_L$.

Furthermore, the disclosed operation method further comprises the following steps of:

turning off the second switch element and turning on the device under test;

inducing the inductor current to flow through the device under test and charging the capacitor; and leading to an increase in a voltage at a source terminal of the device under test as well as a decrease in a voltage drop across a gate terminal and the source terminal of the device under test for measuring a threshold voltage of the device under test.

According to the embodiment of the present invention, since the inductor current flowing through the device under test will be accordingly decreased due to the decrease in the voltage drop across the gate terminal and the source terminal of the device under test ($V_{gs}$), when the inductor current flowing through the device under test reaches a threshold current ($I_{th}$), it can be obtained that a voltage across the gate terminal and the source terminal of the device under test is determined as the threshold voltage of the device under test.

And yet, according to one another embodiment of the present invention, it is also feasible that a differential amplifier can be further electrically connected between the gate terminal and the source terminal of the device under test so as to measure the voltage across the gate terminal and the source terminal of the device under test as the threshold voltage of the device under test.

As a result, to sum up, it should be noted that according to the foregoing disclosed technical contents provided by the Applicants, the present invention is certainly not limited thereto by the above-mentioned embodiments. In other words, for people who are skilled in the art and having ordinary understandings and technical backgrounds to the present invention, it would be allowed for them to make various modifications or changes depending on different circuit regulations and/or specifications without departing from the scope of the invention. That is to say, the present invention is certainly not limited thereto. And the variant embodiments and/or circuit implementations should still fall into the claim scope of the present invention.

In general, those skilled in the art and having general knowledge are able to make appropriate modifications or variations with respective to the technical contents disclosed in the present invention without departing from the spirits of the present invention. The present invention is not restricted by the certain limited configurations and/or circuit diagrams disclosed in the embodiments of the present invention. As such, it is believed that the modifications or variations should still fall into the scope of the present invention, and the present invention covers the modifications and its equality.

As a result, based on the disclosed technical features illustrated as above, it is evident that the present invention is sophisticatedly designed and indeed discloses a novel modified scheme for a power device threshold voltage and dynamic on-resistance measurement circuit to be developed with both faster measuring speed and less expensive circuit cost. And since dynamic on-resistance ($R_{ds,on}$) and threshold voltage ($V_{th}$) instability are both significant reliability concerns for power GaN HEMT devices, and it is known that these issues lead to increased conduction loss and switching time in power electronic circuits, in order to address the measurement of dynamic on-resistance ($R_{ds,on}$) as well as threshold voltage ($V_{th}$) in high speed applications, an evaluation circuit is proposed in this letter. Such evaluation circuit is capable of measuring both parameters during device operations. And by adopting the technical contents of the present invention, it is believed that the present invention achieves in effectively eliminating the conventional drawback issues occurring in the prior arts. In addition, the circuit complexity for implementing such the disclosed power device threshold voltage and dynamic on-resistance measurement circuit can also be made to be relatively low.

As a result, it is believed that the proposed dynamic on-resistance and threshold voltage instability evaluation circuit for power devices and its operation method thereof disclosed by the present invention, are beneficial in view of a great number of merits. Thus, it is believed that the present invention is extremely advantageous while compared to the prior arts.

These and other objectives of the present invention will become obvious to those of ordinary skill in the art after reading the following detailed description of preferred embodiments. And it is to be understood that both the foregoing general description and the following detailed description are exemplary and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
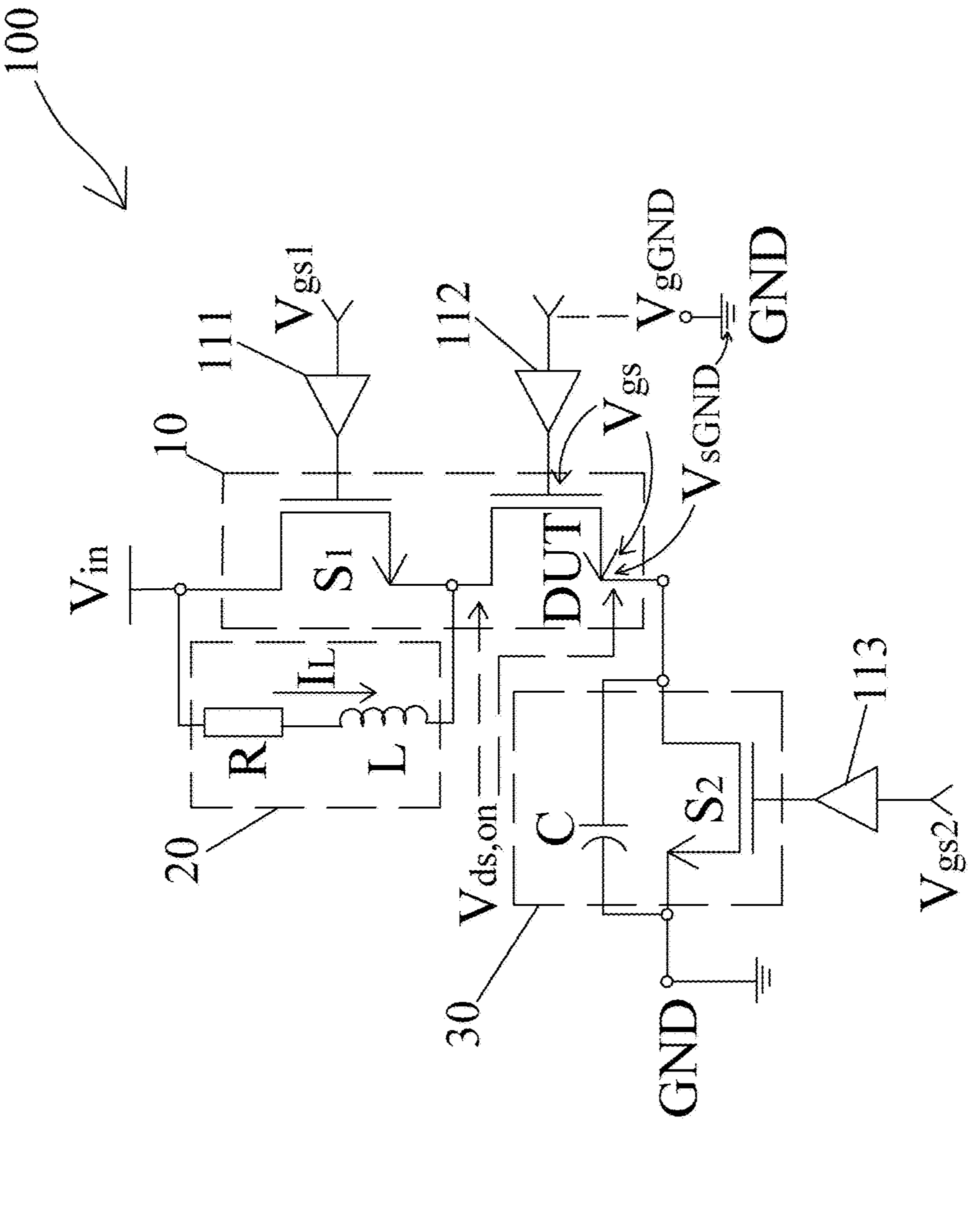
FIG. 1 schematically shows a circuit diagram of a proposed dynamic on-resistance and threshold voltage instability evaluation circuit for power devices in accordance with one embodiment of the present invention.

Reference will now be made in detail to the preferred embodiments of the present invention, examples of which are illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

The embodiments described below are illustrated to demonstrate the technical contents and characteristics of the present invention and to enable the persons skilled in the art to understand, make, and use the present invention. However, it shall be noticed that it is not intended to limit the scope of the present invention. Therefore, any equivalent modification or variation according to the spirit of the present invention is to be also included within the scope of the present invention.

Unless otherwise specified, some conditional sentences or words, such as "can", "could", "might", or "may", usually attempt to express that the embodiment in the invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled to," "couples to," and "coupling to" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the article "a" and "the" includes the meaning of "one or at least one" of the element or component. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. Every example in the present specification cannot limit the claimed scope of the invention.

The terms "substantially," "around," "about" and "approximately" can refer to within 20% of a given value or range, and preferably within 10%. Besides, the quantities provided herein can be approximate ones and can be described with the aforementioned terms if are without being specified. When a quantity, density, or other parameters includes a specified range, preferable range or listed ideal values, their values can be viewed as any number within the given range.

As the Applicants of the present invention have described earlier in the Description of the Prior Art, since a conventional common curve tracer can only apply a minimum of 500 μs pulse for measuring the gate threshold voltage of group III-N based devices (GaN, AlN, and AlGaN), and even though an N1265A curve tracer is able to reduce the minimum pulse width to a minimum of 20 μs, the accompanying setup is still incapable of measuring the gate threshold voltage if a switching time of the device is shorter than 20 μs. Apart from these restrictions, it is also noticeable that an expensive interface for the connection and packaging measurement, as well as a relatively expensive setup are necessarily required in the prior arts. Moreover, since Group III-N based devices (GaN, AlN, and AlGaN) power devices exhibit instability in both dynamic on-resistance ($R_{ds,on}$) and gate threshold voltage ($V_{th}$), a variety of conventional circuits have been proposed to measure these instabilities. However, it is also known that none of the existing circuits, so far, has been acknowledged to be able to effectively measure both the parameters, including the dynamic on-resistance ($R_{ds,on}$) and gate threshold voltage ($V_{th}$) during repetitive switching operations. Instead, separate circuits must be employed to measure each parameter, which actually introduces variability in the circuit parameters and, consequently, in the stress conditions.

In addition, as we know, in the prior arts, although the previously disclosed circuits were able to measure dynamic on-resistance ($R_{ds,on}$) under repetitive switching operations, still these conventional circuits were not able to measure gate threshold voltages ($V_{th}$) of Group III-N based devices (GaN, AlN, and AlGaN) power devices. On the other hand, a typical curve tracer with N1265A was able to measure the gate threshold voltages, but its pulse width was apparently limited to 20 μs as we have discussed before, and the stress conditions were only relevant to the OFF state of the device. As a result, to address the above mentioned issues, the present invention is thus provided and aimed to solve such drawbacks by proposing a novel and inventive evaluation circuit and its operation method thereof.

And moreover, it is also known that a p-GaN gate-based gallium nitride (GaN) power device is a promising technology for power electronics applications. However, it should also be noted that these devices usually suffer from dynamic on-resistance ($R_{ds,on}$) and gate threshold voltage ($V_{th}$) shifts (which is also known as the dynamic on-resistance and gate threshold voltage instabilities) during operation. Among them, the dynamic on-resistance $R_{ds,\ on}$ is typically evaluated in a switching circuit, whereas the gate threshold voltage $V_{th}$ shift is measured using a curve tracer. Both parameter evaluations require distinct setups and do not represent the same operating conditions. As a result, in order to overcome these drawbacks, the present invention is aimed to propose and disclose a circuit that is capable of measuring both parameters in a hard-switching operation under the same operating conditions. Using this proposed circuit diagram, an EPC2014 C device is characterized, and both parameters are reported, which will be discussed in the following descriptions of the present invention.

It is believed that by employing the proposed evaluation circuit and its operation method thereof, it obviously shows that a purpose of the invention is to measure both the dynamic on-resistance ($R_{ds,on}$) and gate threshold voltage ($V_{th}$) for group III-N based devices (GaN, AlN, and AlGaN) power devices under repetitive hard-switching conditions. And such evaluation and measurement circuit and its operation method thereof can be successfully applied to group III-N based devices in high frequency applications for better industrial applications in the future. Hereinafter in the present invention, the Applicants of the Application practically propose a dynamic on-resistance and threshold voltage instability evaluation circuit for power devices. For the gate threshold voltage ($V_{th}$) as well as dynamic on-resistance ($R_{ds,on}$) measurement, the purposed evaluation and measurement circuit along with its operation method thereof will now be provided and illustrated by the embodiment as described in the following sections for clear understandings and for your references.

At first, please refer to FIG. 1, which schematically shows a circuit diagram of a proposed dynamic on-resistance and threshold voltage instability evaluation circuit for power devices in accordance with one embodiment of the present invention. According to the embodiment of the present invention, the proposed dynamic on-resistance and threshold voltage instability evaluation circuit 100 comprises a half-bridge circuit 10, an assemble load 20 and a switch combining circuit 30. The half-bridge (HB) circuit 10 comprises a first switch element $S_1$ and a device under test DUT, and the first switch element $S_1$ and the device under test DUT are electrically connected in series. An input voltage $V_{in}$ is provided and electrically connected to the half-bridge circuit 10, such that the half-bridge circuit 10 is adapted to receive the input voltage $V_{in}$.

The assemble load 20 comprises a resistor R and an inductor L, and the resistor R and the inductor L are connected in series. According to the embodiment of the present invention, the assemble load 20 is electrically connected between the input voltage $V_{in}$ and a midpoint of the half-bridge circuit 10. To be more specific, it can be seen that one end of the resistor R is electrically connected with the input voltage $V_{in}$ while another end of the resistor R is electrically connected with the inductor L. As such, the inductor L is further electrically connected to a joint where the first switch element $S_1$ and the device under test DUT are connected. According to the technical contents of the present invention, the resistor R and the inductor L are adopted to compose the disclosed assemble load 20 in order to enable repetitive hard-switching operation of the device under test DUT for dynamic on-resistance ($R_{ds,on}$) measurement of the device under test DUT.

According to the present invention, the switch combining circuit 30 is further disposed and electrically connected between the half-bridge circuit 10 and a ground terminal GND. And, according to the technical contents of the present invention, the switch combining circuit 30 is employed for enabling threshold voltage ($V_{th}$) measurement of the device under test DUT.

Regarding the detailed configurations, the switch combining circuit 30 comprises a second switch element $S_2$ and a capacitor C, and the second switch element $S_2$ and the capacitor C are electrically connected in parallel. As can be seen, the first switch element $S_1$ of the half-bridge circuit 10 can be implemented by using a metal oxide semiconductor field effect transistor (MOSFET), and the second switch element $S_2$ of the switch combining circuit 30 may be implemented by using a metal oxide semiconductor field effect transistor (MOSFET) as well. A drain terminal of the first switch element $S_1$ is electrically connected to the input voltage $V_{in}$, a gate terminal of the first switch element $S_1$ is electrically connected with a first gate driver 111 for receiving a first driving voltage such that the first driving voltage is a gate driving voltage of the first switch element $S_1$. And a source terminal of the first switch element $S_1$ is electrically connected with the inductor L of the assemble load 20 and the device under test DUT. As can be seen in FIG. 1, a gate to source voltage of the first switch element $S_1$ is indicated by $V_{gs1}$. And the first switch element $S_1$ is operable and adapted to be controlled through the gate to source voltage $V_{gs1}$ when applying the gate to source voltage $V_{gs1}$ in view of the first gate driver 111.

Moreover, according to the embodiment of the present invention, the device under test DUT is also a three-terminal component, which includes a first terminal, a second terminal and a third terminal. In the embodiment of the present invention, the device under test DUT can be preferably a power device of which is fabricated in using Group III-N based semiconductor materials. For instance, the device under test DUT can be and yet not limited to a Group III-N based GaN, AlN, or AlGaN switching power device. According to the embodiment of the present invention, the first terminal of the device under test DUT is a drain terminal of the power device, which is electrically connected to the source terminal of the first switch element $S_1$ and the inductor L of the assemble load 20. The second terminal of the device under test DUT is a gate terminal of the power device, which is configured for receiving a second driving voltage. As can be seen, a second gate driver 112 is further disposed and electrically connected with the gate terminal of the device under test DUT such that the second driving voltage is a gate driving voltage of the device under test DUT. As can be seen in FIG. 1, a gate to ground voltage of the device under test DUT is indicated by $V_{gGND}$. As a result, by such configuration, the device under test DUT is operable and adapted to be controlled by the gate driving voltage through its gate terminal as the gate to ground voltage $V_{gGND}$ is applied to the device under test DUT. In addition, the third terminal of the device under test DUT is a source terminal of the power device, and the source terminal of the device under test DUT is electrically connected with the second switch element $S_2$ and the capacitor C of the switch combining circuit 30.

To be more specific, as can be seen in the FIG. 1 scheme, the first switch element $S_1$ and the device under test DUT forms the half-bridge circuit 10. And the device under test DUT is disposed and configured as a lower switch of the half-bridge circuit 10, while the first switch element $S_1$ is disposed and configured as an upper switch of the half-bridge circuit 10.

In addition, according to the embodiment of the present invention, the second switch element $S_2$ may also be a three-terminal component, which includes a first terminal, a second terminal and a third terminal. In the embodiment of the present invention, the second switch element $S_2$ is preferably a metal oxide semiconductor field effect transistor (MOSFET), wherein a drain terminal of the metal oxide semiconductor field effect transistor is electrically connected to the device under test DUT of the half-bridge circuit 10, a gate terminal of the metal oxide semiconductor field effect transistor is electrically connected with a third gate driver 113 for receiving a third driving voltage such that the third driving voltage is a gate driving voltage of the second switch element $S_2$, and a source terminal of the metal oxide semiconductor field effect transistor is electrically connected with the ground terminal GND. As can be seen in FIG. 1, a gate to source voltage of the second switch element $S_2$ is indicated by $V_{gs2}$. And the second switch element $S_2$ is operable and adapted to be controlled through the gate to source voltage $V_{gs2}$ when applying the gate to source voltage $V_{gs2}$ in view of the third gate driver 113. As a result, by employing the circuit configurations as disclosed above, it is believed that the second switch element $S_2$ in parallel with the capacitor C compose the switch combining circuit 30 such that the switch combining circuit 30 is adopted so as to enable threshold voltage ($V_{th}$) measurement of the device under test DUT.

Figure 2:
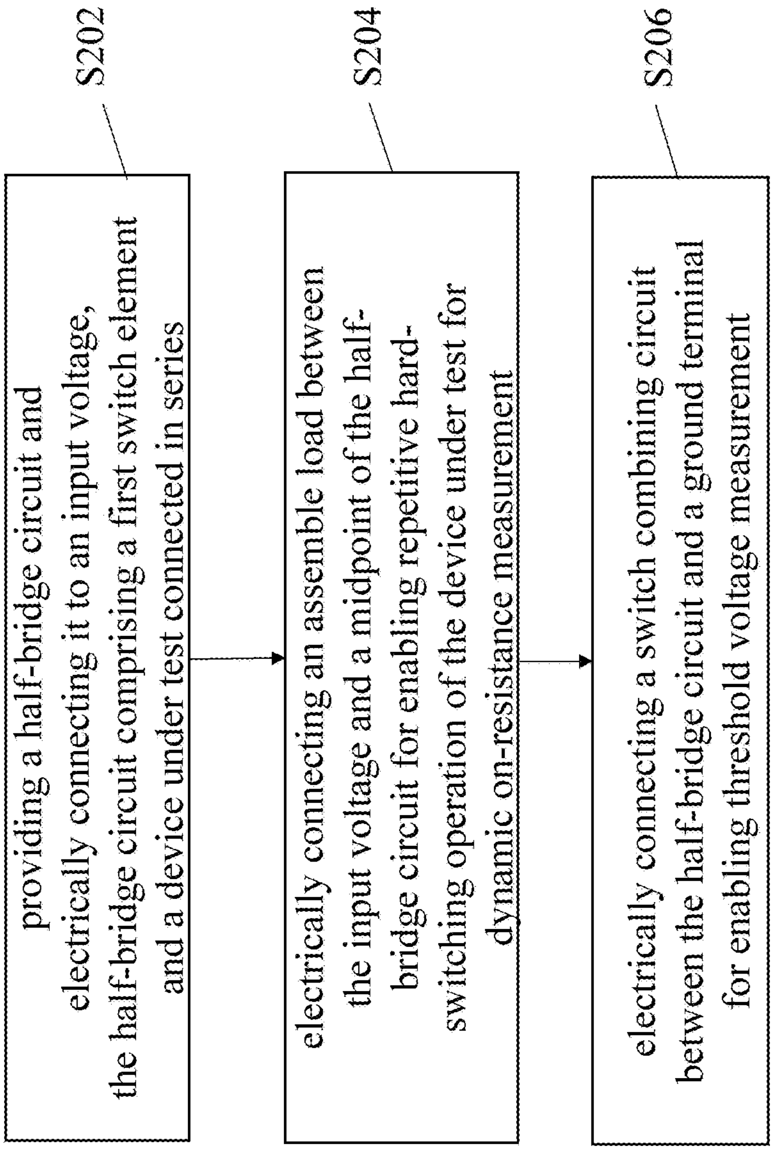
FIG. 2 schematically illustrates a flow chart of the proposed operation method of the dynamic on-resistance and threshold voltage instability evaluation circuit for power devices in accordance with the embodiment as illustrated in FIG. 1 of the present invention.

As a result, while regarding the operation method of the disclosed power device dynamic on-resistance and threshold voltage instability evaluation circuit as discussed above, the Applicants of the present invention provide a flow chart as shown in FIG. 2 in the following sections for a better understanding and more detailed descriptions. Please refer to FIG. 2 of the present invention, which schematically illustrates a flow chart of the proposed operation method of the dynamic on-resistance and threshold voltage instability evaluation circuit for power devices in accordance with the embodiment as illustrated in FIG. 1 of the present invention. As can be seen in the flow chart of FIG. 2, the proposed operation method comprises a following steps of S202, S204 and S206. First, as described in the step of S202, a half-bridge circuit is provided and being electrically to an input voltage. As we can see from the circuit schematic diagram in FIG. 1, the half-bridge circuit 10 comprising the first switch element $S_1$ and the device under test DUT which are connected in series is electrically connected to the input voltage $V_{in}$ and receiving the input voltage $V_{in}$. And then, in the step of S204, an assemble load is provided and being electrically connected between the input voltage $V_{in}$ and a midpoint of the half-bridge circuit 10. As we can see from the circuit schematic diagram in FIG. 1, the assemble load 20 comprising the resistor R and the inductor L which are connected in series is an RL load for enabling repetitive hard-switching operation of the device under test DUT for dynamic on-resistance measurement of the device under test DUT. And successively, in the step of S206, a switch combining circuit is provided and being electrically connected between the half-bridge circuit and a ground terminal. As illustrated in the circuit diagram in FIG. 1, it is the switch combining circuit 30 composed of the second switch element $S_2$ and the capacitor C which are electrically connected in parallel, such that the switch combining circuit 30 is employed in order to enable threshold voltage measurement of the device under test DUT.

In the following paragraphs, the Applicants of the present Application further disclose the detailed descriptions of the dynamic on-resistance ($R_{ds,on}$) measurement and the threshold voltage ($V_{th}$) measurement of the proposed circuit. Please find the detailed descriptions accompanying with the waveforms in FIG. 3 for better understandings. In general, for dynamic $R_{ds,on}$ measurement, the second switch element $S_2$ is turned on to connect the source terminal of the device under test DUT to the ground terminal GND. And on the contrary, during the $V_{th}$ measurement, the second switch element $S_2$ will be turned off, leading to the rise in the voltage of the capacitor C (which is the $V_{sGND}$ in FIG. 1) until the gate to source voltage of the device under test DUT (as indicated by $V_{gs}$) reaches its threshold voltage $V_{th}$.

Figure 3:
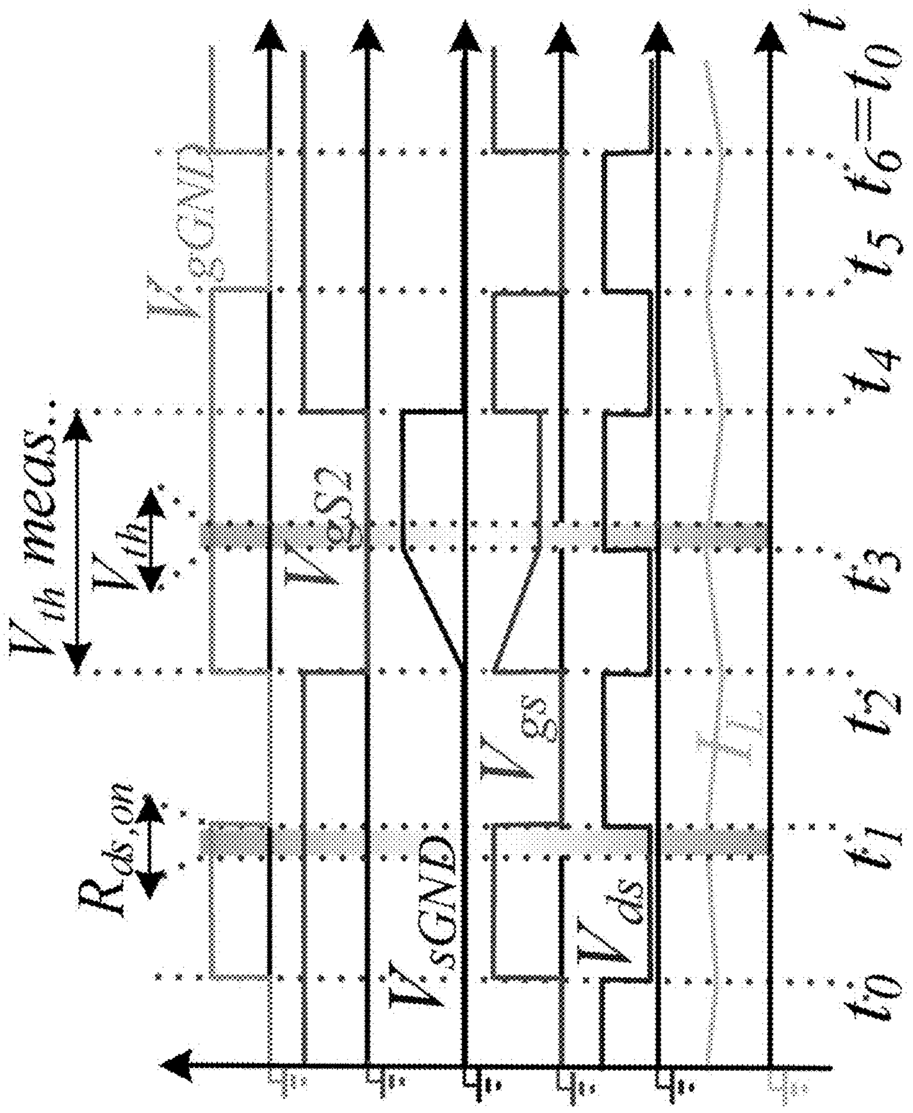
FIG. 3 shows a voltage versus time (V-t) curve diagram of the accompanying signal waveforms of the proposed dynamic on-resistance and threshold voltage instability evaluation circuit for power devices in accordance with the embodiment in FIG. 1 of the present invention.
Figure 4:
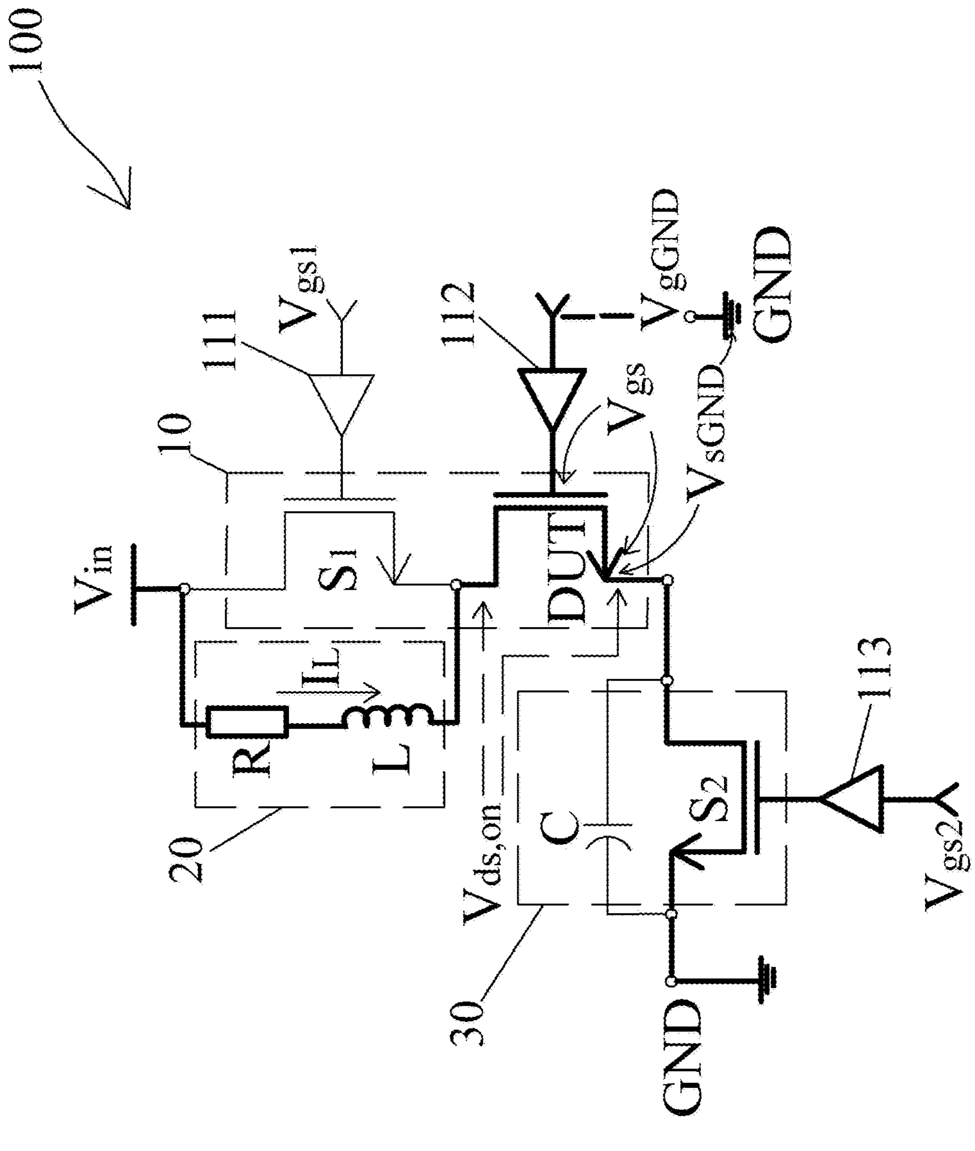
FIG. 4 schematically shows an equivalent circuit diagram during the dynamic on-resistance $R_{ds,on}$ characterization process according to the embodiment of the present invention while the second switch element is turned on and the device under test is turned on in between the time interval $t_0$~$t_1$ and $t_4$~$t_5$.

In the following, please refer to the operational key waveforms of the proposed invention in FIG. 3. It is apparent that the present invention is mainly operating in two modes:

1. For Dynamic On-Resistance ($R_{ds,On}$) Measurement:

Regarding measuring the dynamic on-resistance ($R_{ds,on}$) under repetitive switching of the device under test DUT, the proposed invention operates as follows: the second switch element $S_2$ is kept turned on by applying a high gate voltage, as a high voltage level of the gate to source voltage $V_{gs2}$ of the second switch element $S_2$. At this time, the first switch element $S_1$ and the device under test DUT are operated complementarily at a certain duty cycle (d) and frequency ($f_{sw}$). And during the ON state of the device under test DUT, an inductor current ($I_L$) flowing through the RL load will be increased due to the applied input voltage $V_{in}$ voltage across the RL load. The equivalent circuit diagram during the dynamic on-resistance ($R_{ds,on}$) characterization process according to the embodiment of the present invention while the second switch element $S_2$ is turned on and the device under test DUT is turned on, is illustrated and provided as shown in FIG. 4 of the invention. And FIG. 4 shows the equivalent circuit diagram according to the time period in the interval from $t_0$~$t_1$, and from $t_4$~$t_5$ in FIG. 3.

Figure 5:
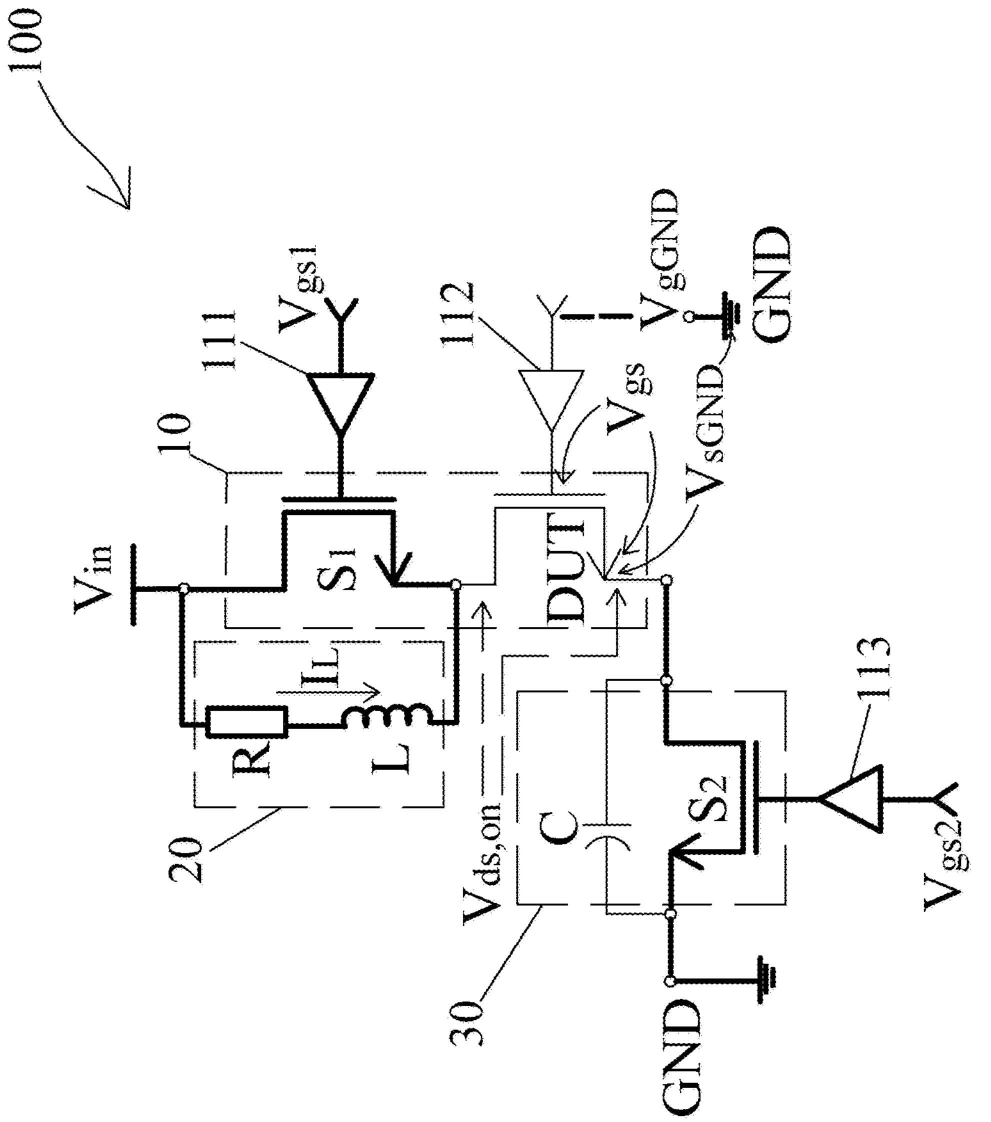
FIG. 5 schematically shows an equivalent circuit diagram during the dynamic on-resistance $R_{ds,on}$ characterization process according to the embodiment of the present invention while the second switch element is turned on and the device under test is turned off in between the time interval $t_1$~$t_2$ and $t_5$~$t_6$.

And afterwards, during the OFF state of the device under test DUT, the inductor current ($I_L$) will be decreased to reach a steady state where the dynamic on-resistance ($R_{ds,on}$) of the device under test DUT can be measured. FIG. 5 schematically shows the equivalent circuit diagram during the dynamic on-resistance ($R_{ds,on}$) characterization process according to the embodiment of the present invention while the second switch element $S_2$ is turned on and yet the device under test DUT is turned off. The equivalent circuit diagram according to the time period in the interval from $t_1$~$t_2$, and from $t_5$~$t_6$ in FIG. 3 is shown and illustrated as in FIG. 5.

As can be seen, to be specific, according to the present invention, the inductor current ($I_L$) will be decreased due to the ($I_L \times R_s$ drop), as shown in FIG. 5, where $R_s$ is the resistance of the resistor R. And the steady-state operation is achieved once when the inductor current "$I_L$" is equal to "$d \times V_{in}/R_s$", where d is the certain duty cycle, $V_{in}$ is a voltage value of the input voltage and $R_s$ is the resistance of the resistor R, such that $I_L = d \times V_{in}/R_s$.

And after that, when the steady state is achieved as "$I_L = d \times V_{in}/R_s$", an on-state voltage across the device under test can be measured as "$V_{ds,on}$". According to an alternative embodiment of the present invention, a differential amplifier may be optionally in electrically connection between the drain terminal and the source terminal of the device under test DUT so as to measure the voltage across the drain terminal and the source terminal of the device under test DUT as the on-state voltage $V_{ds,on}$ across the device under test DUT. As a result, it is derived that the dynamic on-resistance ($R_{ds,on}$) of the device under test DUT can be obtained as "$V_{ds,on}/I_L$" as the on-state voltage $V_{ds,on}$ is divided by the inductor current $I_L$ to obtain the dynamic on-resistance ($R_{ds,on}$) of the device under test DUT.

Figure 6:
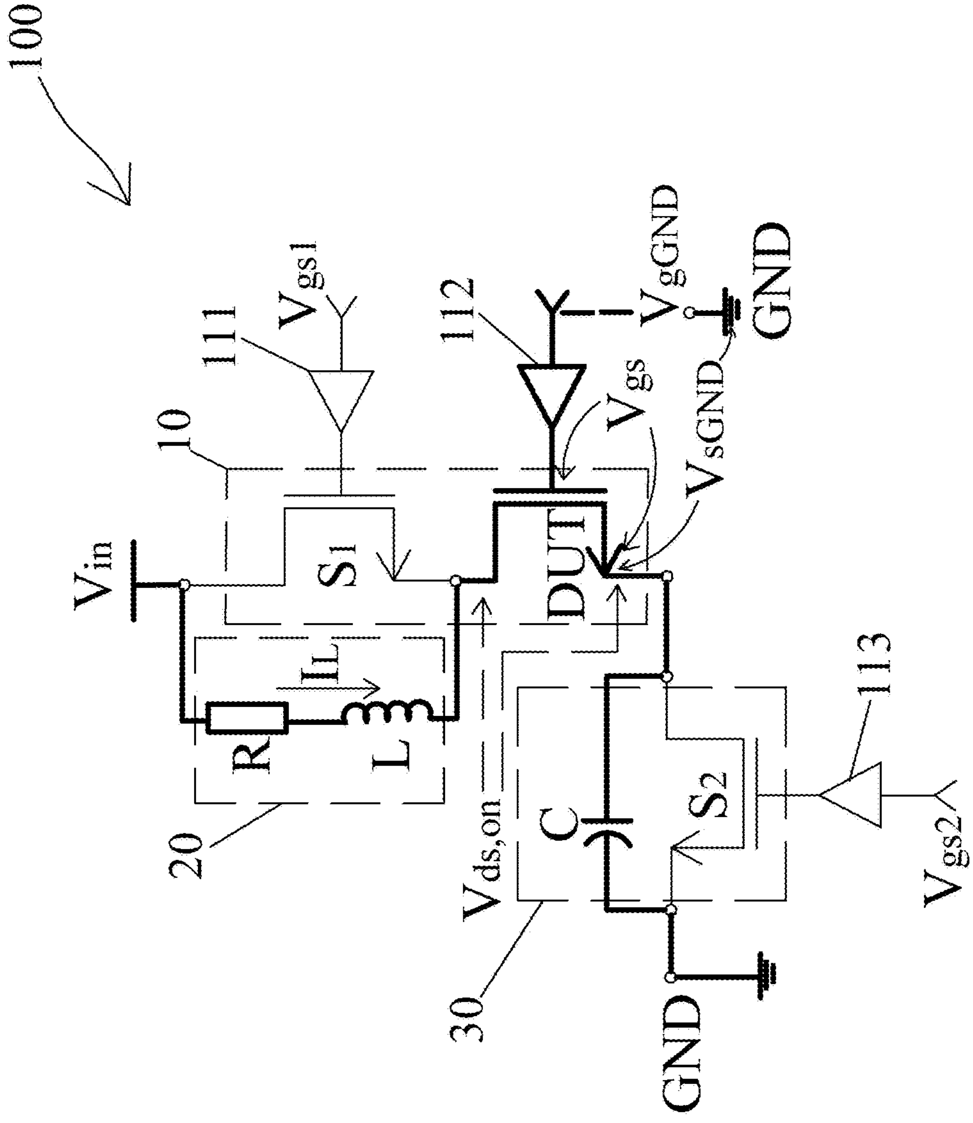
FIG. 6 schematically shows an equivalent circuit diagram during the threshold voltage $V_{th}$ characterization process according to the embodiment of the present invention while the second switch element is turned off and the device under test is turned on in between the time interval $t_2$~$t_3$.

2. For Threshold Voltage ($V_{th}$) Measurement:

On the contrary, while regarding measuring the threshold voltage ($V_{th}$) of the device under test DUT, please find the schematic drawing in FIG. 6 for the equivalent circuit diagram during the threshold voltage ($V_{th}$) characterization process according to the embodiment of the present invention while the second switch element $S_2$ is turned off and the device under test DUT is turned on. Such equivalent circuit diagram in FIG. 6 is illustrated according to the time period in the interval from $t_2$~$t_3$ in FIG. 3.

As we can see, in such the time period when the second switch element $S_2$ is turned off and the device under test DUT is turned on as the $V_{gGND}$ becomes high, the inductor current $I_L$ flows through the device under test DUT and charges the capacitor C, which leads to an increase in a voltage at a source terminal of the device under test DUT as $V_{sGND}$. As a result, such operation accordingly causes a decrease in a voltage drop across the gate terminal and the source terminal of the device under test DUT as the decrease in the $V_{gs}$ voltage. Please find the corresponding operational waveforms in FIG. 3 as the same time. And due to the decrease in the voltage drop across the gate terminal and the source terminal of the device under test as the $V_{gs}$ voltage gradually decreases, it is believed that the inductor current $I_L$ flowing through the device under test DUT will be accordingly decreased and finally will reach a threshold value. And therefore, according to the embodiment of the present invention, when the inductor current $I_L$ reaches a threshold current ($I_{th}$), a voltage across the gate terminal and the source terminal of the device under test DUT can be measured and determined as a threshold voltage ($V_{th}$) of the device under test DUT.

According to a practical embodiment of the present invention, a differential amplifier may be alternatively in electrical connection between the gate terminal and the source terminal of the device under test DUT so as to measure the voltage across the gate terminal and the source terminal of the device under test DUT as the threshold voltage ($V_{th}$) of the device under test DUT. As a result, it is derived that the threshold voltage ($V_{th}$) of the device under test DUT can be obtained as measurements by employing the present invention.

Figure 7:
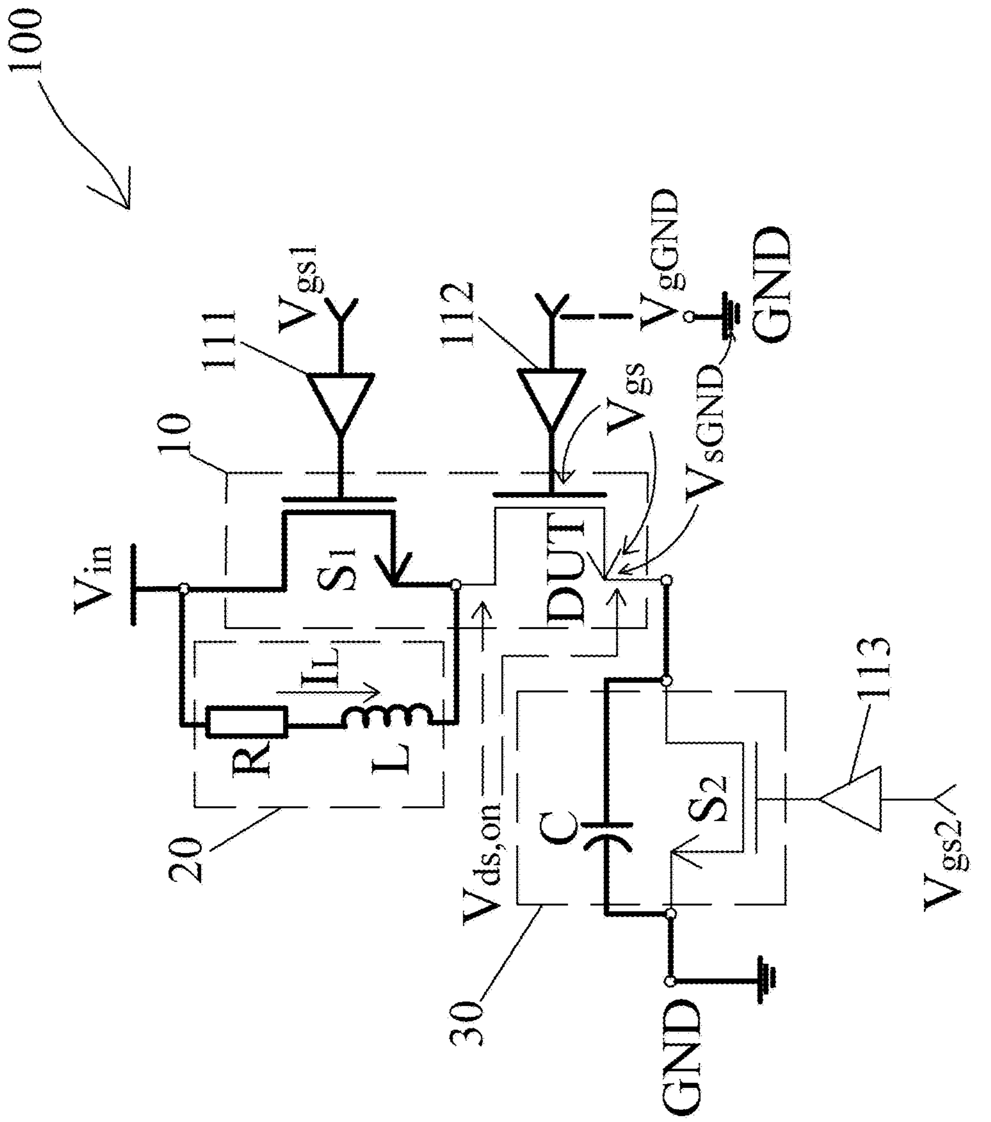
FIG. 7 schematically shows an equivalent circuit diagram after the threshold voltage $V_{th}$ characterization process is complete according to the embodiment of the present invention while the second switch element is turned off and the device under test is turned off in between the time interval $t_3$~$t_4$.

And after the threshold voltage ($V_{th}$) of the device under test DUT is measured, the device under test DUT is turned off. Please find the schematic drawing in FIG. 7 for the equivalent circuit diagram after the threshold voltage ($V_{th}$) measurement is complete under the circumstance that the second switch element $S_2$ is turned off and the device under test DUT is turned off according to the embodiment of the present invention. Such equivalent circuit diagram in FIG. 7 is illustrated according to the time period in the interval from $t_3$~$t_4$ in FIG. 3. At this time, it can be observed that the inductor current $I_L$ freewheels through the first switch element $S_1$ of the half-bridge circuit 10.

It is noted that according to the embodiment of the present invention, in the drawings of FIG. 4, FIG. 5, FIG. 6 and FIG. 7, in order to provide a clear view and understanding of the above disclosed descriptions, the Applicants of the Application illustrate the active component which is at an ON state, with thicker lines while the inactive component which is at an OFF state with thinner lines, instead.

And shortly after the operation in FIG. 7, the second switch element $S_2$ can be successively turned on again to discharge the capacitor C and pull down the source terminal of the device under test DUT to a ground voltage. It is believed that such operation is able to allow the device under test DUT and the first switch element $S_1$ of the half-bridge circuit 10 to continue operating in a steady-state condition.

As a result, to sum above, it is apparent that the present invention is proposed to provide a circuit that is able to measure both instability parameters ($R_{ds,on}$ and $V_{th}$) under repetitive switching conditions. The proposed circuit consists of a series connection of a half-bridge circuit with an RL load and a bypass switch with a capacitor connected in parallel. The device under test (DUT) is connected as a lower switch of the half-bridge circuit. The half-bridge circuit with an RL load enables repetitive switching operation to evaluate dynamic on-resistance ($R_{ds,on}$). And as a result, it is believed that one key advantage of this proposed circuit is its ability to measure both instabilities using one single test circuit during repetitive hard-switching operations.

According to the embodiment of the present invention, this invention is also aimed to provide a circuit that is designed to characterize both the threshold voltage instability and dynamic on-resistance instability for group III-N based devices. By employing the technical solution proposed by the invention, a purpose of the invention is to measure the dynamic on-resistance ($R_{ds,on}$) and gate threshold voltage ($V_{th}$) for group III-N based devices (including, for example, GaN, AlN, and AlGaN) devices under repetitive hard-switching conditions and furthermore in many useful high frequency applications. The present invention is advantageous for having no inherent delay between stress and measurement time, and therefore it can be made and controlled viable for evaluating gate threshold voltage and dynamic on-state resistance for group III-N based devices. In addition, since the present invention is able to provide a pulse measuring time which is lesser than 2 μs, and such a short pulse is able to represent the real operating switching frequency for group III-N based devices, it makes the present invention be able to measure the dynamic on-state resistance and threshold voltage shift in actual application for group III-N based devices. As a result, it is believed that the applicable fields of the present invention may include, and yet not limited to applicable products such as smartphone chargers, portable electronics and tools, onboard chargers and DC to DC converters, or solar inverters. Many alternative applicable industries, for instance, consumer electronics, automotive, renewable energy, and data centers may also be applied thereto.

As can be seen, since it has been well known that dynamic on-resistance ($R_{ds,on}$) and gate threshold voltage ($V_{th}$) instabilities are two significant reliability concerns for power GaN HEMT devices, and these issues may lead to increased conduction loss and switching time in power electronic circuits, in order to address the measurement of both dynamic on-resistance ($R_{ds,on}$) and gate threshold voltage ($V_{th}$) in hard switching applications, an evaluation circuit is proposed as disclosed above in this disclosure and such proposed evaluation circuit is capable of measuring both parameters during device operation. Furthermore, in order to demonstrate its capability, an EPC2014 C device can be moreover, characterized, for obtaining parameter values of $\{R_{ds,on}$=14.8 mΩ, 17.8 mΩ, 19.8 mΩ$\}$ and $\{V_{th}$=1.41, 1.423, 1.448V$\}$ at $\{V_{in}$=12, 24, 32 V$\}$, respectively. In general, the DUT (EPC2014C) is operated at duty (d)=0.4, switching frequency ($f_{sw}$)=250 kHz and load resistance (R)=6 ohm in the steady state for input voltage $V_{in}$=12, 24, 32 V, respectively. Then the present invention is able to obtain the parameters of dynamic $R_{ds,on}$=14.8 mΩ, 17.8 mΩ, 19.8 mΩ and $V_{th}$=1.41, 1.423, 1.448V for the respective input voltage $V_{in}$=12, 24, 32 V. And even more, instability values caused by trapping effects are separated from the values, resulting in $\{R_{ds,on}$=2.32, 4.684, 6 mΩ$\}$ and $\{V_{th}$=18, 41, 76 mV$\}$ at $\{V_{in}$=12, 24, 32 V$\}$, respectively. In specific, during the measurement, the case temperature ($T_C$) of the device under test (DUT) is also measured using the FLIR A655sc at a frame rate of 200 Hz. The measured temperatures are 32.5° C., 42.8° C., and 54.3° C. for the respective input voltage $V_{in}$=12, 24, and 32V operating conditions. The rise in temperature induces thermal effects on both parameters including the dynamic on-resistance $R_{ds,on}$ and the gate threshold voltage $V_{th}$. Hence, subtracting thermal effects from the values resulting in increased dynamic on-resistance $R_{ds,on}$ due to trapping $\{R_{ds,on}$=2.32, 4.684, 6 mΩ$\}$, and threshold voltage shift due to trapping $\{V_{th}$=18, 41, 76 mV$\}$ at input voltage $V_{in}$=12, 24, 32V, respectively.

The alternative variations and embodiments may also be made by people who are skilled in the art and having ordinary skills of the art. And yet, the present invention still covers the modifications and its equality based on the disclosed technical contents of the present invention.

As a result, to sum up, according to the technical contents of the present invention, the Applicants of the present invention provide a plurality of feasible embodiments in the above-mentioned paragraphs for implementing the inventive effect of the invention for your references. It is apparent that, compared to the conventional prior arts, the present invention is characterized by providing a novel power device dynamic on-resistance and threshold voltage measurement circuit and its operation method thereof. As can be seen from the plurality of embodiments, it is obvious that this invention offers a low-cost circuit capable of measuring both the instabilities of dynamic on-resistance and threshold voltage of a power device. In addition, a much shorter pulse width, faster measuring speed and inexpensive measuring equipment are accomplished by using this invention. Thereby, it is believed that the present invention can be effectively applied for group III-N based devices in high-frequency applications.

Among all, the Applicants of the present invention have disclosed a plurality of applicable embodiments, which are advantageous of having extraordinary layout flexibility and can be composed of a variety of layout designs. Accordingly, in view of the technical contents and manners disclosed in the present invention without departing from the spirits of the present invention, it is believed that those skilled in the art and having general knowledge are able to make appropriate modifications or variations based on necessary circuit layout requirements, and the present invention is not restricted by the certain limited configurations and/or circuit diagrams as disclosed in the embodiments of the present invention. As a result, either the modifications or the variations should still fall into the scope of the present invention, and the present invention covers the modifications and its equality.

More specifically, according to the technical characteristics of the present invention which have been provided by the Applicants as illustrated in the previous paragraphs, it is obvious that the disclosed technical solution of the present invention is effective. As can be seen from the embodiments, it, in view of all, should be apparent and obvious that the present invention is not only novel and inventive but also believed to be advantageous of solving and avoiding the conventional issues existing in the prior arts.

As a result, when compared to the prior arts, it is ensured that the present invention apparently shows much more effective performances than before. In addition, it is believed that the present invention is instinct, effective and highly competitive for IC technology and industries in the market nowadays, whereby having extraordinary availability and competitiveness for future industrial developments and being in condition for early allowance.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A dynamic on-resistance and threshold voltage instability evaluation circuit for power devices, comprising:

a half-bridge circuit, being electrically connected to and receiving an input voltage, wherein the half-bridge circuit comprises a first switch element and a device under test which are connected in series;

an assemble load, being electrically connected between the input voltage and a midpoint of the half-bridge circuit, and the assemble load enabling repetitive hard-switching operation of the device under test for dynamic on-resistance measurement of the device under test; and a switch combining circuit, being electrically connected between the half-bridge circuit and a ground terminal, and the switch combining circuit enabling threshold voltage measurement of the device under test, wherein the switch combining circuit comprises a second switch element and a capacitor which are connected in parallel, the second switch element is a metal oxide semiconductor field effect transistor (MOSFET), and wherein a drain terminal of the metal oxide semiconductor field effect transistor is electrically connected to the device under test of the half-bridge circuit, a gate terminal of the metal oxide semiconductor field effect transistor is electrically connected with a third gate driver for receiving a third driving voltage such that the third driving voltage is a gate driving voltage of the second switch element, and a source terminal of the metal oxide semiconductor field effect transistor is electrically connected with the ground terminal.

2. The dynamic on-resistance and threshold voltage instability evaluation circuit for power devices according to claim 1, wherein the device under test is a power device, and the power device is fabricated using Group III-N based semiconductor materials.

3. The dynamic on-resistance and threshold voltage instability evaluation circuit for power devices according to claim 1, wherein the first switch element is a metal oxide semiconductor field effect transistor (MOSFET), a drain terminal of the metal oxide semiconductor field effect transistor is electrically connected to the input voltage, a gate terminal of the metal oxide semiconductor field effect transistor is electrically connected with a first gate driver for receiving a first driving voltage such that the first driving voltage is a gate driving voltage of the first switch element, and a source terminal of the metal oxide semiconductor field effect transistor is electrically connected with the assemble load and the device under test.

4. The dynamic on-resistance and threshold voltage instability evaluation circuit for power devices according to claim 3, wherein the device under test is a Group III-N based MOSFET, a drain terminal of the Group III-N based MOSFET is electrically connected to the source terminal of the first switch element and the assemble load, a gate terminal of the Group III-N based MOSFET is electrically connected with a second gate driver for receiving a second driving voltage such that the second driving voltage is a gate driving voltage of the device under test, and a source terminal of the Group III-N based MOSFET is electrically connected with the switch combining circuit.

5. The dynamic on-resistance and threshold voltage instability evaluation circuit for power devices according to claim 1, wherein the assemble load comprises a resistor and an inductor which are connected in series, one end of the resistor is electrically connected with the input voltage while another end of the resistor is electrically connected with the inductor, and the inductor is further electrically connected to a joint where the first switch element and the device under test are connected.

6. The dynamic on-resistance and threshold voltage instability evaluation circuit for power devices according to claim 1, wherein the second switch element is turned on and the first switch element and the device under test are operated complementarily at a certain duty cycle, and wherein during an on state of the device under test, an inductor current flowing through the assemble load is increased, and wherein during an off state of the device under test, the inductor current is decreased to reach a steady state where a dynamic on-resistance of the device under test is measured.

7. The dynamic on-resistance and threshold voltage instability evaluation circuit for power devices according to claim 6, wherein the assemble load comprises a resistor and an inductor which are connected in series, and a resistance of the resistor is equal to "$R_s$", and wherein the steady state is achieved when the inductor current "$I_L$" is equal to "$d \times V_{in}/R_s$", where d is the certain duty cycle, $V_{in}$ is a voltage value of the input voltage and $R_s$ is the resistance of the resistor, such that $I_L = d \times V_{in}/R_s$.

8. The dynamic on-resistance and threshold voltage instability evaluation circuit for power devices according to claim 7, wherein when the steady state is achieved as "$I_L = d \times V_{in}/R_s$", an on-state voltage across the device under test is measured as "$V_{as,on}$", and the dynamic on-resistance of the device under test is obtained as "$V_{as,on}/I_L$".

9. The dynamic on-resistance and threshold voltage instability evaluation circuit for power devices according to claim 6, wherein the second switch element is turned off and the device under test is turned on such that the inductor current flows through the device under test and charges the capacitor, leading to an increase in a voltage at a source terminal of the device under test and a decrease in a voltage drop across a gate terminal and the source terminal of the device under test.

10. The dynamic on-resistance and threshold voltage instability evaluation circuit for power devices according to claim 9, wherein the inductor current flowing through the device under test is accordingly decreased due to the decrease in the voltage drop across the gate terminal and the source terminal of the device under test, and wherein when the inductor current flowing through the device under test reaches a threshold current ($I_{th}$), a voltage across the gate terminal and the source terminal of the device under test is determined as a threshold voltage of the device under test.

11. The dynamic on-resistance and threshold voltage instability evaluation circuit for power devices according to claim 10, wherein after the threshold voltage of the device under test is measured, the device under test is turned off and the inductor current freewheels through the first switch element.

12. The dynamic on-resistance and threshold voltage instability evaluation circuit for power devices according to claim 11, wherein the second switch element is successively turned on to discharge the capacitor and pull down the source terminal of the device under test to a ground voltage, allowing the device under test and the first switch element to continue operating in a steady-state condition.

13. An operation method of a dynamic on-resistance and threshold voltage instability evaluation circuit for power devices, comprising:

providing a half-bridge circuit and electrically connecting the half-bridge circuit to an input voltage, the half-bridge circuit comprising a first switch element and a device under test which are connected in series;

electrically connecting an assemble load between the input voltage and a midpoint of the half-bridge circuit for enabling repetitive hard-switching operation of the device under test for dynamic on-resistance measurement of the device under test; and electrically connecting a switch combining circuit between the half-bridge circuit and a ground terminal, such that the switch combining circuit enables threshold voltage measurement of the device under test, wherein the switch combining circuit comprises a second switch element and a capacitor which are connected in parallel, the second switch element is a metal oxide semiconductor field effect transistor (MOSFET), and wherein a drain terminal of the metal oxide semiconductor field effect transistor is electrically connected to the device under test of the half-bridge circuit, a gate terminal of the metal oxide semiconductor field effect transistor is electrically connected with a gate driver for receiving a gate driving voltage, and a source terminal of the metal oxide semiconductor field effect transistor is electrically connected with the ground terminal.

14. The operation method of the dynamic on-resistance and threshold voltage instability evaluation circuit for power devices according to claim 13, further comprising:

turning on the second switch element and controlling the first switch element and the device under test to operate complementarily at a certain duty cycle;

turning on the device under test, such that an inductor current flowing through the assemble load is increased; and turning off the device under test, such that the inductor current is decreased to reach a steady state where a dynamic on-resistance of the device under test is measured.

15. The operation method of the dynamic on-resistance and threshold voltage instability evaluation circuit for power devices according to claim 14, wherein the assemble load comprises a resistor and an inductor which are connected in series, and a resistance of the resistor is equal to "$R_s$", and wherein the steady state is achieved when the inductor current "$I_L$" is equal to "$d \times V_{in}/R_s$", where d is the certain duty cycle, $V_{in}$ is a voltage value of the input voltage and $R_s$ is the resistance of the resistor, such that $I_L = d \times V_{in}/R_s$.

16. The operation method of the dynamic on-resistance and threshold voltage instability evaluation circuit for power devices according to claim 15, wherein when the steady state is achieved as "$I_L = d \times V_{in}/R_s$", an on-state voltage across the device under test is measured as "$V_{as,on}$", and the dynamic on-resistance of the device under test is obtained as "$V_{as,on}/I_L$".

17. The operation method of the dynamic on-resistance and threshold voltage instability evaluation circuit for power devices according to claim 16, further comprising:

turning off the second switch element and turning on the device under test; inducing the inductor current to flow through the device under test and charging the capacitor; and leading to an increase in a voltage at a source terminal of the device under test and a decrease in a voltage drop across a gate terminal and the source terminal of the device under test for measuring a threshold voltage of the device under test.

18. The operation method of the dynamic on-resistance and threshold voltage instability evaluation circuit for power devices according to claim 17, wherein the inductor current flowing through the device under test is accordingly decreased due to the decrease in the voltage drop across the gate terminal and the source terminal of the device under test, and wherein when the inductor current flowing through the device under test reaches a threshold current ($I_{th}$), a voltage across the gate terminal and the source terminal of the device under test is determined as the threshold voltage of the device under test.

19. The operation method of the dynamic on-resistance and threshold voltage instability evaluation circuit for power devices according to claim 18, wherein after the threshold voltage of the device under test is measured, the device under test is turned off and the inductor current freewheels through the first switch element.

20. The operation method of the dynamic on-resistance and threshold voltage instability evaluation circuit for power devices according to claim 19, wherein the second switch element is successively turned on to discharge the capacitor and pull down the source terminal of the device under test to a ground voltage, allowing the device under test and the first switch element to continue operating in a steady-state condition.

21. The operation method of the dynamic on-resistance and threshold voltage instability evaluation circuit for power devices according to claim 13, wherein the device under test is a power device, and the power device is fabricated using Group III-N based semiconductor materials.

* * * * *